(12) United States Patent
Hai et al.

(10) Patent No.: US 11,972,629 B2
(45) Date of Patent: Apr. 30, 2024

(54) TEXTURE RECOGNITION APPARATUS AND ELECTRONIC APPARATUS

(71) Applicant: BOE TECHNOLOGY GROUP CO., LTD., Beijing (CN)

(72) Inventors: Xiaoquan Hai, Beijing (CN); Xue Dong, Beijing (CN); Lei Wang, Beijing (CN); Yingzi Wang, Beijing (CN); Xuan Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 67 days.

(21) Appl. No.: 17/764,582

(22) PCT Filed: May 25, 2021

(86) PCT No.: PCT/CN2021/095637
§ 371 (c)(1),
(2) Date: Mar. 29, 2022

(87) PCT Pub. No.: WO2021/258957
PCT Pub. Date: Dec. 30, 2021

(65) Prior Publication Data
US 2022/0351540 A1    Nov. 3, 2022

(30) Foreign Application Priority Data

Jun. 23, 2020  (CN) .......................... 202010578730.5

(51) Int. Cl.
*G06V 40/13*    (2022.01)
*H10K 50/86*    (2023.01)
(Continued)

(52) U.S. Cl.
CPC ......... *G06V 40/1318* (2022.01); *H10K 50/86* (2023.02); *H10K 59/122* (2023.02); *G06V 40/1359* (2022.01); *H10K 59/65* (2023.02)

(58) Field of Classification Search
CPC .............. G06K 9/0004; G06V 40/1318; H01L 27/3227; H01L 27/3234
See application file for complete search history.

(56) References Cited

U.S. PATENT DOCUMENTS

| 10,990,794 B2 | 4/2021 | Hai et al. |
| 2018/0012069 A1 | 1/2018 | Chung et al. |

(Continued)

FOREIGN PATENT DOCUMENTS

| CN | 107480639 A | 12/2017 |
| CN | 107480661 A | 12/2017 |

(Continued)

*Primary Examiner* — Yuzhen Shen
(74) *Attorney, Agent, or Firm* — Chiwin Law LLC

(57) ABSTRACT

A texture recognition apparatus and an electronic apparatus are provided. The texture recognition apparatus has a touch side surface, and includes a light source array, an image sensor array and a light shielding matrix, the light source array includes a plurality of light sources; the image sensor array includes a plurality of image sensors, the plurality of image sensors are configured to receive light emitted from the plurality of light sources and reflected by a texture to the plurality of image sensors; the light shielding matrix includes a plurality of light shielding patterns arranged in an array, each of the plurality of image sensors includes a photosensitive element; the plurality of light sources do not overlap with the plurality of light shielding patterns, a photosensitive element of each of the plurality of image sensors at least partially overlaps with at least one or the plurality of light shielding patterns.

17 Claims, 10 Drawing Sheets

(51) Int. Cl.
*H10K 59/122* (2023.01)
*G06V 40/12* (2022.01)
*H10K 59/65* (2023.01)

(56) References Cited

U.S. PATENT DOCUMENTS

| | | | |
|---|---|---|---|
| 2018/0060641 A1 | 3/2018 | Kim et al. | |
| 2019/0026530 A1* | 1/2019 | Wu | G06V 40/1324 |
| 2020/0105841 A1* | 4/2020 | Bang | H01L 31/022408 |
| 2020/0167580 A1* | 5/2020 | Cho | G06F 3/0412 |

FOREIGN PATENT DOCUMENTS

| | | |
|---|---|---|
| CN | 107590428 A | 1/2018 |
| CN | 109598248 A | 4/2019 |
| CN | 110633695 A | 12/2019 |

\* cited by examiner

TEXTURE RECOGNITION APPARATUS AND ELECTRONIC APPARATUS

This application is a U.S. National Phase Entry of International Application No. PCT/CN2021/095637, filed on May 25, 2021, designating the United States of America and claiming priority to Chinese Patent Application No. 202010578730.5, filed on Jun. 23, 2020. The present application claims priority to and the benefit of the above-identified applications and the above-identified applications are incorporated by reference herein in their entirety.

TECHNICAL FIELD

Embodiments of the present disclosure relate to a texture recognition apparatus and an electronic apparatus.

BACKGROUND

With increasing popularity of mobile terminals, more and more users use the mobile terminals to perform operations such as identity verification and electronic payment. Due to uniqueness of skin texture, such as fingerprint patterns or palmprint patterns, a fingerprint recognition technology combined with optical imaging is gradually adopted by mobile electronic devices for identity verification, electronic payment, etc. How to design a more optimized texture recognition apparatus is a focus problem in the art.

SUMMARY

At least one embodiment of the present disclosure provides a texture recognition apparatus, the texture recognition apparatus has a touch side surface, and comprises a light source array, an image sensor array, and a light shielding matrix, the light source array comprises a plurality of light sources; the image sensor array comprises a plurality of image sensors, the plurality of image sensors are configured to be able to receive light emitted from the plurality of light sources and reflected by a texture to the plurality of image sensors for texture image collection, the light shielding matrix is on a light incident side of the image sensor array, and comprises a plurality of light shielding patterns arranged in an array, each of the plurality of image sensors comprises a photosensitive element; in a direction perpendicular to the touch side surface, the plurality of light sources do not overlap with the plurality of light shielding patterns; and a photosensitive element of each of the plurality of image sensors at least partially overlaps with at least one of the plurality of light shielding patterns.

For example, in the texture recognition apparatus provided by at least one embodiment of the present disclosure, the photosensitive element of each of the plurality of image sensors at least partially overlaps with one of the plurality of light shielding patterns, with respect to one light shielding pattern and a photosensitive element of one image sensor that are provided correspondingly, an orthogonal projection of the photosensitive element on a plane where the one light shielding pattern is located is located inside the light shielding pattern.

For example, in the texture recognition apparatus provided by at least one embodiment of the present disclosure, in a first direction parallel to the touch side surface, a length of the light shielding pattern is D, a length of the photosensitive element is d1; and in the direction perpendicular to the touch side surface, a distance from the light shielding pattern to the photosensitive element is h, then:

$$D = d1 + 2h \times \tan\theta 1,$$

where $\theta 1$ is a minimum critical angle of an optical path for texture recognition.

For example, in the texture recognition apparatus provided by at least one embodiment of the present disclosure, a planar shape of the photosensitive element is a square or a rectangle; a side length of the square or a length or a width of the rectangle extends along the first direction, so that the side length of the square or the length or the width of the rectangle is d1, and 10 microns ≤ d1 ≤ 20 microns.

For example, in the texture recognition apparatus provided by at least one embodiment of the present disclosure, a range of a distance h from the light shielding pattern to the photosensitive element is: 3 microns ≤ h ≤ 5 microns.

For example, the texture recognition apparatus provided by at least one embodiment of the present disclosure further comprises a light shielding layer between the light shielding matrix and the image sensor array, the light shielding layer comprises a plurality of first openings, in the direction perpendicular to the touch side surface, a photosensitive element of each of the plurality of image sensors at least partially overlaps with at least one of the plurality of first openings; and the plurality of light shielding patterns are in one-to-one correspondence and at least partially overlap with the plurality of first openings.

For example, in the texture recognition apparatus provided by at least one embodiment of the present disclosure, with respect to one photosensitive element and at least one first opening that are provided correspondingly, an orthogonal projection of the at least one first opening on a plane where the photosensitive element is located is located inside the photosensitive element.

For example, in the texture recognition apparatus provided by at least one embodiment of the present disclosure, a photosensitive element of each of the plurality of image sensors at least partially overlaps with one of the plurality of first openings; and the plurality of light shielding patterns are in one-to-one correspondence and at least partially overlap with the plurality of first openings; with respect to one light shielding pattern and one first opening that are provided correspondingly, in the first direction parallel to the touch side surface, a length of the light shielding pattern is D, a length of the first opening is d2; and in the direction perpendicular to the touch side surface, a distance from the light shielding pattern to the light shielding layer is H, then:

$$D = d2 + 2H \times \tan\theta 1,$$

where $\theta 1$ is a minimum critical angle of the optical path for texture recognition.

For example, in the texture recognition apparatus provided by at least one embodiment of the present disclosure, a photosensitive element of each of the plurality of image sensors at least partially overlap with at least two of the plurality of first openings; and the plurality of light shielding patterns are in one-to-one correspondence and at least partially overlap with the plurality of first openings; with respect to one photosensitive element, at least two first openings and at least two light shielding patterns that are provided correspondingly, in the first direction parallel to the touch side surface, a length of the light shielding pattern is D, a distance between two adjacent light shielding patterns is P, a length of the first opening is d2; and in the direction perpendicular to the touch side surface, a distance from the light shielding pattern to the light shielding layer is H, then:

$$D = d2 + 2H \times \tan\theta1,$$

$$P = H \times (\tan\theta1 + \tan\theta2),$$

where θ1 is a minimum critical angle of the optical path for texture recognition, and θ2 is a maximum critical angle of the optical path for texture recognition.

For example, in the texture recognition apparatus provided by at least one embodiment of the present disclosure, a planar shape of the first opening is a circle, a square or a rectangle; in a case where the planar shape of the first opening is the circle, a diameter of the circle is d2, and 2 microns≤d2≤12.8 microns; or in a case where the planar shape of the first opening is the square or the rectangle, a side length of the square or a length or a width of the rectangle extends along the first direction, and the side length of the square or the length or the width of the rectangle is d2, and 2 microns≤d2≤12.8 microns.

For example, in the texture recognition apparatus provided by at least one embodiment of the present disclosure, a range of the distance H from the light shielding pattern to the light shielding layer is: 4 microns≤H≤6 microns.

For example, the texture recognition apparatus provided by at least one embodiment of the present disclosure further comprises a display panel, the display panel comprises an array substrate; the array substrate comprises a base substrate and a sub-pixel array on the base substrate; the sub-pixel array comprises a plurality of sub-pixels, the light source array comprises the sub-pixel array; and the plurality of light sources comprise the plurality of sub-pixels.

For example, in the texture recognition apparatus provided by at least one embodiment of the present disclosure, each of the plurality of sub-pixels comprises a pixel driving circuit on the base substrate; the pixel driving circuit comprises a thin film transistor; each of the plurality of image sensors further comprises a switch transistor on the base substrate; and the thin film transistor and the switch transistor are arranged in a same layer.

For example, in the texture recognition apparatus provided by at least one embodiment of the present disclosure, the photosensitive element is provided on a side of the switch transistor away from the base substrate, and comprises a first electrode, a second electrode and a semiconductor layer between the first electrode and the second electrode; the first electrode is electrically connected with the switch transistor; the array substrate further comprises a planarization layer provided on a side of the photosensitive element away from the base substrate; and the planarization layer has a first via and a second via; each of the plurality of sub-pixels further comprises a light-emitting device; and the light-emitting device is provided on a side of the planarization layer away from the base substrate; the light-emitting device comprises a first light emission driving electrode, a second light emission driving electrode, and a light-emitting layer between the first light emission driving electrode and the second light emission driving electrode; the first light emission driving electrode is electrically connected with the thin film transistor at least through the first via; the array substrate further comprises a connecting line provided in a same layer as the first light emission driving electrode; and the connecting line is electrically connected with the second electrode of the photosensitive element through the second via.

For example, in the texture recognition apparatus provided by at least one embodiment of the present disclosure, the array substrate further comprises a pixel definition layer provided on a side of the first light emission driving electrode and the connecting line away from the base substrate; the pixel definition layer has a second opening exposing the first light emission driving electrode; and the light-emitting layer and the second light emission driving electrode are respectively at least partially formed in the second opening; the light shielding matrix is provided on a side of the pixel definition layer away from the base substrate.

For example, in the texture recognition apparatus provided by at least one embodiment of the present disclosure, the pixel definition layer is configured to filter light with a wavelength greater than 600 nm.

For example, in the texture recognition apparatus provided by at least one embodiment of the present disclosure, the planarization layer is configured to comprise a light shielding layer, or the pixel definition layer is configured to comprise a light shielding layer, or both the planarization layer and the pixel definition layer are configured to respectively comprise a light shielding layer.

At least one embodiment of the present disclosure further provides an electronic apparatus, the electronic apparatus comprises any one of the above texture recognition apparatuses.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
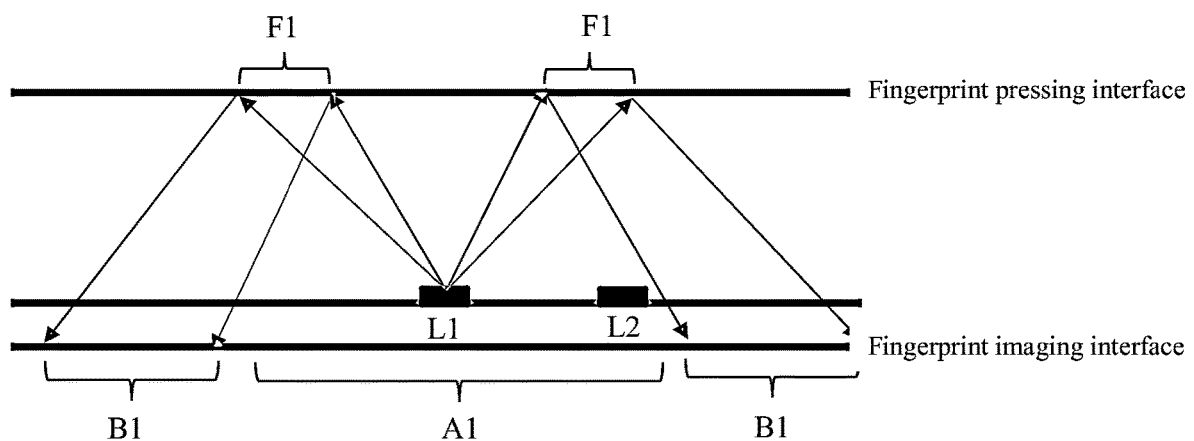
FIG. 1A is a schematic diagram of fingerprint imaging.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At present, narrow frames are gradually becoming a mainstream in design and fabrication of display apparatuses, especially for portable display apparatuses such as mobile phones. One of the means to implement a narrow frame is to integrate an image sensor having a fingerprint recognition function into the display apparatus, to implement an under-screen fingerprint recognition mode, increase an area of a display region of the display apparatus, and further increase a screen-to-body ratio.

For example, a point light source, a line light source, a light source having a certain pattern or the like may be used as a photosensitive light source of the image sensor, to perform fingerprint recognition. In addition, there are diverse ways to arrange the light source and the image sensor, for example, the light source may be arranged on a side of the image sensor close to fingerprint touch, or the light source may be arranged on the same plane as the image sensor, or the light source may also be arranged on a side of the image sensor away from fingerprint touch. The arrangement mode of the light source and the image sensor may be selected and set according to different needs.

Hereinafter, a fingerprint recognition principle is introduced by taking the case that the point light source is used as the photosensitive light source of the image sensor and the light source is arranged on the side of the image sensor close to fingerprint touch as an example, but this does not form limitation on the embodiments of the present disclosure.

In a reflective optical fingerprint recognizing apparatus, during a fingerprint recognition process, as shown in FIG. 1A, when a point light source L1 emits light, light emitted thereby irradiates a fingerprint pressing interface (e.g., an outer surface of a glass screen) at different angles; due to an effect of total reflection of the fingerprint pressing interface, a portion of the light whose incident angle is greater than or equal to a critical angle θ of total reflection will undergo total reflection, resulting in that the portion of light cannot be emergent from the fingerprint pressing interface, thereby generating a total reflection region. Correspondingly, a portion of the light whose incident angle is less than the critical angle θ of total reflection is emergent from the fingerprint pressing interface. Therefore, a texture image may be collected through the light reflected by the total reflection region; for example, a clear texture image is formed at B1 of the fingerprint imaging interface where the image sensor is located, and the texture image corresponds to a portion of the fingerprint located at F1, F1 is the total reflection region, and B1 is the imaging region.

Specifically, for example, when a fingerprint of a user's finger is pressed to the total reflection region F1, a ridge of the fingerprint touches a surface of the total reflection region F1, so a total reflection condition in a position corresponding to the ridge of the fingerprint is destroyed, so the light will be emitted in the corresponding position, so that an original reflection path is changed, and a valley of the fingerprint will not touch the surface of the total reflection region F1, a total reflection condition of a position corresponding to the valley of the fingerprint is not destroyed, and therefore the light is still totally reflected in the corresponding position, so that the original reflection path is not changed. In this way, due to different effects of valleys and ridges of the fingerprint on the total reflection condition of light in the total reflection region, the light incident on the fingerprint imaging interface forms bright-dark texture images in different positions.

In addition, because there is interference caused by light emitted from the fingerprint pressing interface and reflected by the fingerprint, etc., or light emitted by the light source and reflected by other functional layers to the fingerprint imaging interface before reaching the fingerprint pressing interface, A1 of the fingerprint imaging interface becomes a detection invalid region, and this region cannot form a valid texture image. In the invalid region A1, in the light emitted by the light source L1, a portion that is reflected by other functional layers to the fingerprint imaging interface before reaching the fingerprint pressing interface, and a portion that is almost vertically reflected by the fingerprint pressing interface have high brightness, which is basically located in a center position of the invalid region A1, thereby forming a highlight region; the highlight region generates a greater photoelectric signal in a corresponding portion of the image sensor array due to high brightness of the light, so that a residual image is easily formed, the highlight region may also be referred to as a residual image region.

Figure 1B:
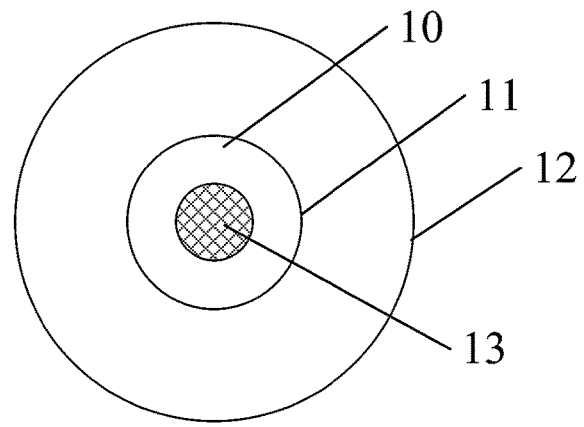
FIG. 1B is a schematic diagram of an imaging range of a point light source.

For example, FIG. 1B shows an imaging range diagram of a point light source. As shown in FIG. 1B, in a photosensitive range of the point light source, a valid imaging range is in a ring shape, that is, in FIG. 1B, a ring-shaped region between an inner circle 11 and an outer circle 12 is the valid imaging range, which corresponds to an imaging region B1 corresponding to the total reflection region F1 in FIG. 1A; a region within the inner circle 11 of the ring shape (hereinafter referred to as a ring center 10) is an invalid imaging region, corresponding to the invalid region A1 in FIG. 1A; a portion of the region 13 inside the ring center 10 (a shadow region) is a highlight region (a residual image region) that tends to cause a residual image in the image sensor array during imaging.

Figure 1C:
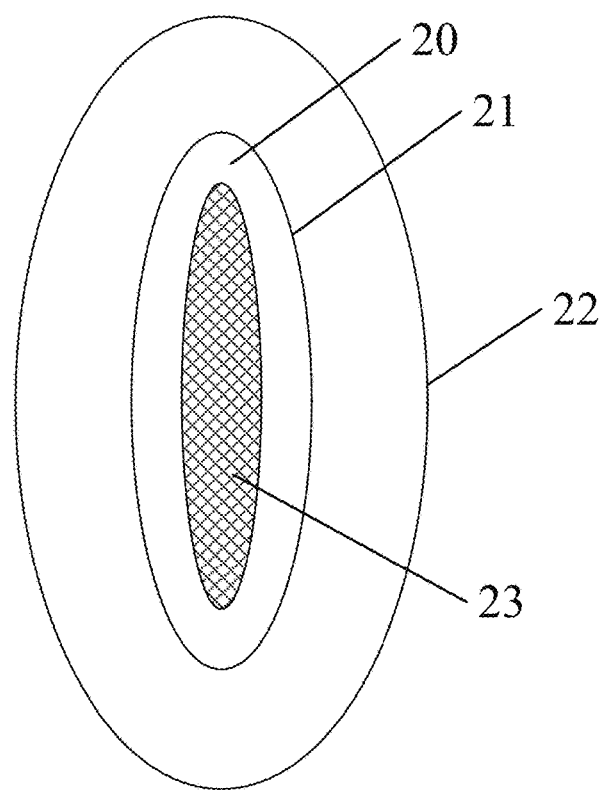
FIG. 1C is a schematic diagram of an imaging range of a line light source.

Similarly, FIG. 1C shows an imaging range diagram of a line light source. As shown in FIG. 1C, a valid imaging range of a line light source is a racetrack-like ring-shaped region or a long-elliptical ring-shaped region between the inner circle 21 and the outer circle 22; a ring center 20 is an invalid imaging region; and a portion of the region inside the ring center 10 (a shadow region) 23 is a highlight region (a residual image region) that tends to cause a residual image in the image sensor array during imaging.

In addition, in a process of fingerprint recognition, in addition to light emitted by the light source that may be sensed by the image sensor, the image sensor may also sense ambient light incident through a finger or the like. Because the image sensor receives light passively, and the light emitted by the light source array will not be actively distinguished from the ambient light, ambient light may interfere with fingerprint recognition of the image sensor, resulting in blurred or even failed texture imaging. In some embodiments, a light-blocking element may be provided in the texture imaging apparatus to block ambient light and prevent strong light from affecting texture recognition of the image sensor; but the light-blocking element will affect the signal light for texture recognition while filtering the ambient light, and the ambient light filtering effect is limited while ensuring intensity of the signal light, it is difficult to take both into account at the same time.

At least one embodiment of the present disclosure provides a texture recognition apparatus, the texture recognition apparatus has a touch side surface, and includes a light source array, an image sensor array and a light shielding matrix; the light source array includes a plurality of light sources; the image sensor array includes a plurality of image sensors, the plurality of image sensors are configured to receive light emitted from the plurality of light sources and reflected by a texture to the plurality of image sensors for texture image collection; the light shielding matrix is located on a light incident side of the image sensor array, and includes a plurality of light shielding patterns arranged in an array, each of the plurality of image sensors includes a photosensitive element; in a direction perpendicular to the touch side surface, the plurality of light sources do not overlap with the plurality of light shielding patterns, and a photosensitive element of each of the plurality of image sensors at least partially overlaps with at least one of the plurality of light shielding patterns. The light shielding matrix in the texture recognition apparatus can shield ambient light to prevent ambient light from entering the image sensor and affecting normal operation of the image sensor; and the light shielding matrix basically does not shield signal light for texture collection, thereby improving a texture collection effect of the image sensor.

At least one embodiment of the present disclosure further provides an electronic apparatus, the electronic apparatus includes the above-described texture recognition apparatus.

The texture recognition apparatus and the electronic apparatus according to the present disclosure will be exemplarily described below through several specific embodiments.

Figure 2:
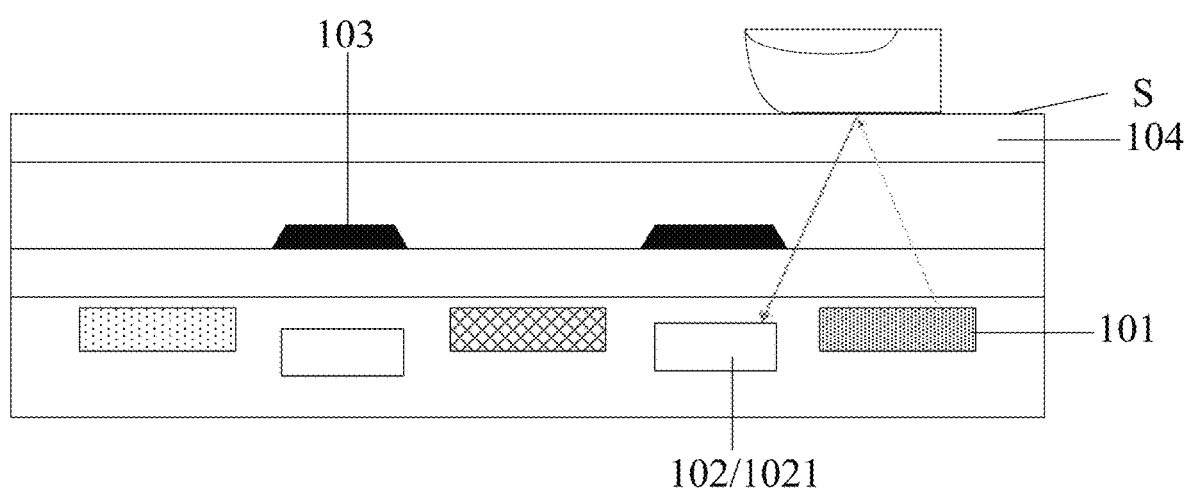
FIG. 2 is a cross-sectional schematic diagram of a texture recognition apparatus provided by at least one embodiment of the present disclosure.

At least one embodiment of the present disclosure provides a texture recognition apparatus, and FIG. 2 shows a cross-sectional schematic diagram of the texture recognition apparatus.

As shown in FIG. 2, the texture recognition apparatus has a touch side surface S, and includes a light source array, an image sensor array and a light shielding matrix. For example, a touch side of the texture recognition apparatus has a cover plate 104, for example, a glass cover plate; and a surface of the cover plate 104 is formed as the touch side surface S. When an operating body having a texture such as a finger or a palm touches the touch side surface S, the texture recognition apparatus may collect and recognize the texture such as a fingerprint or a palmprint.

For example, the light source array includes a plurality of light sources 101; and the plurality of light sources 101 are arranged in an array in a predetermined region. The image sensor array includes a plurality of image sensors 102; and the plurality of image sensors 102 are arranged in an array in a predetermined region. The plurality of image sensors 102 are configured to be able to receive light emitted from the plurality of light sources 101 and reflected by the texture to the plurality of image sensors 102 for texture image collection.

For example, the light shielding matrix is on a light incident side of the image sensor array, that is, a side of the image sensor array close to the touch side surface S, shown as an upper side of the image sensor array in the figure, and includes a plurality of light shielding patterns 103 arranged in an array. Each of the plurality of image sensors 102 includes a photosensitive element 1021, and in a direction perpendicular to the touch side surface S, that is, in a vertical direction in the figure, the plurality of light sources 101 do not overlap with the plurality of light shielding patterns 103, and a photosensitive element 1021 of each of the plurality of image sensors 102 at least partially overlaps with at least one of the plurality of light shielding patterns 102, that is, a photosensitive element 1021 of each image sensor 102 is correspondingly provided with at least one light shielding pattern 103.

Therefore, the light shielding matrix can shield ambient light on the incident side of the image sensor array, so as to prevent ambient light from entering the image sensor and affecting normal operation of the image sensor; and the light shielding matrix basically does not shield signal light used for texture collection (which will be described in detail later), thereby improving a texture collection effect of the image sensor.

For example, when an operating body having a texture such as a finger touches the touch side surface S of the texture recognition apparatus, light emitted by the light source 101 may be reflected by the operating body and pass through gaps between the plurality of light shielding patterns 103 to reach the image sensor 102, and the image sensor 102 may collect the texture image of the operating body by sensing the light.

As described above, the operating body having a texture may be a hand, and the texture recognized by the image sensor 102 is a skin texture, for example, a fingerprint, a palmprint, etc.; in addition, the operating body having a texture may also be a non-biological object having a certain texture, for example, an object having a certain texture made of a material such as resin, the embodiments of the present disclosure are not limited in this aspect.

Figure 3:
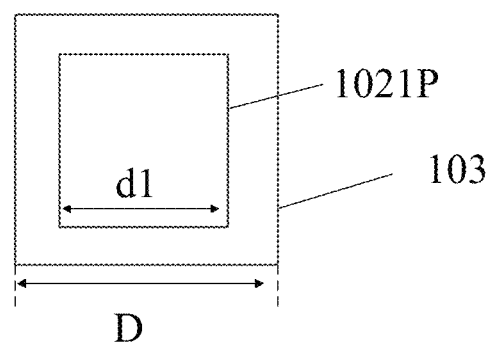
FIG. 3 is a schematic plan view of a light shielding pattern and a photosensitive element in a texture recognition apparatus provided by at least one embodiment of the present disclosure.

For example, as shown in FIG. 2, a photosensitive element 1021 of each of the plurality of image sensors 102 at least partially overlaps with one of the plurality of light shielding patterns 103; as shown in FIG. 3, with respect to one light shielding pattern 103 and a photosensitive element 1021 of one image sensor 102 provided correspondingly, an orthogonal projection 1021P of the photosensitive element 1021 on a plane where the light shielding pattern 103 is located is located inside the light shielding pattern 103.

Figure 4:
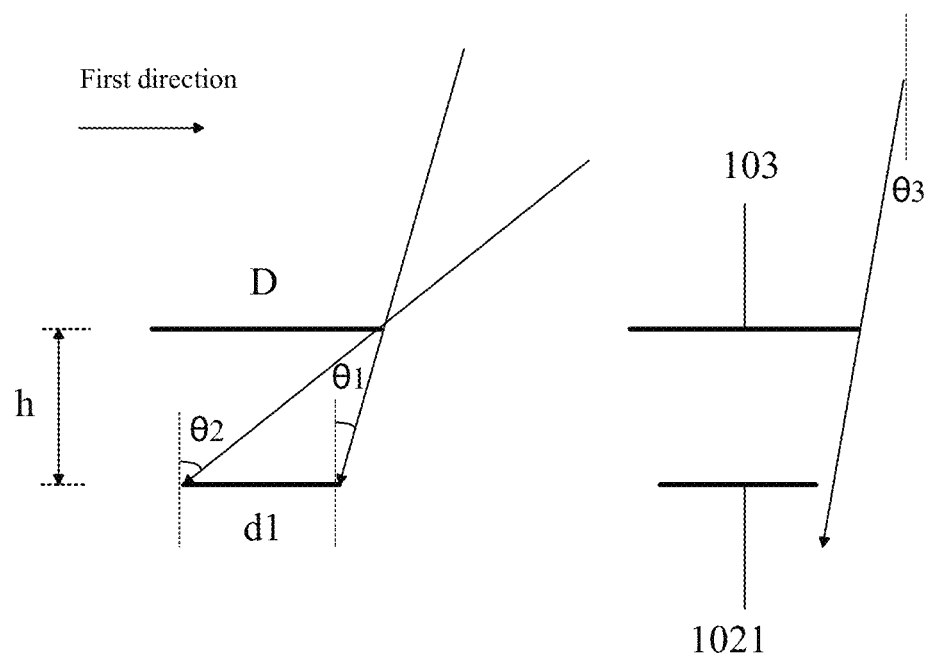
FIG. 4 is a schematic diagram of a texture recognition optical path in a texture recognition apparatus provided by at least one embodiment of the present disclosure.

For example, in some embodiments, as shown in FIG. 4, in a first direction parallel to the touch side surface S, for example, a horizontal direction in FIG. 2, a length of the light shielding pattern 103 is D, and a length of the photosensitive element 1021 is d1; in a direction S perpendicular to the touch side surface, a distance from the light shielding pattern 103 to the photosensitive element 1021 is h, then:

$$D = d1 + 2h \times \tan \theta1,$$

Where θ1 is a minimum critical angle of an optical path for texture recognition. In addition, the optical path for texture recognition also has a maximum critical angle θ2. When light emitted from the plurality of light sources 101 is reflected by the texture to the plurality of image sensors 102, due to effects of refraction, etc. of the protective cover plate 104 and the internal structure of the texture recognition apparatus, an angle range of signal light incident to the image sensor 102 is θ1 to θ2. For example, θ1 is determined by a refractive index of the protective cover plate 104, and θ1 is a total reflection critical angle of the protective cover plate 104; for example, in an example, the refractive index of the protective cover plate 104 is about 1.53, then the total reflection critical angle θ1 is about 41° to 42°. For example, θ2 is determined by signal light intensity and responsivity of the image sensor 102, e.g., in some examples, θ2 ranges from 60° to 80°, e.g., 70°. In addition, due to effects of refraction, etc. of the protective cover plate 104 and the internal structure of the texture recognition apparatus, a maximum angle at which ambient light enters the image sensor 102 is θ3; in some examples, θ3 calculated from the refractive index of the protective cover plate 104 is approximately 41° to 42° and in order to ensure that ambient light does not irradiate on the photosensitive element 1021 of the image sensor 102, θ1≥θ3, so that a size relationship between D, h and d1 can be obtained according to the above formula.

For example, in some embodiments, as shown in FIG. 3, a planar shape of the photosensitive element 1021 of the image sensor 102 is a square or a rectangle; and a side length of the square or a length or a width of the rectangle extends along the above-described first direction, so that the side length of the square or the length or the width of the rectangle is d1, and 10 microns≤d1≤20 microns, for example, d1 is 13 microns, 15 microns, or 18 microns, etc. Thus, the photosensitive element 1021 of the image sensor 102 has a surface large enough to receive light emitted from the plurality of light sources 101 and reflected by the texture to the plurality of image sensors 102.

For example, in some embodiments, in order to facilitate arrangement of devices inside the texture recognition apparatus and formation of a signal optical path for texture recognition, a range of the distance h from the light shielding pattern 103 to the photosensitive element 1021 may be: 3 microns≤h≤5 microns, for example, h is 3 microns or 4 microns, etc.

For example, a planar shape of the light shielding pattern 103 is the same as the planar shape of the photosensitive element 1021. In some examples, the planar shape of the photosensitive element 1021 is a square, a range of a side length d1 of the square is 10 microns≤d1≤20 microns, a distance h from the light shielding pattern 103 to the photosensitive element 1021 is 3 microns; and a range of a side length D of the light shielding pattern 103 is calculated according to the above formula as 17.2 microns≤D≤27.2 microns.

For example, in one example, the side length d1 of the photosensitive element 1021 is 18 microns; the distance h from the light shielding pattern 103 to the photosensitive element 1021 is 3 microns; and the side length D of the light shielding pattern 103 is calculated according to the above formula as 25.4 microns.

An optical simulation test is performed on the texture recognition apparatus of the above-described example, and a result shows that when simulated ambient light enters the texture recognition apparatus with intensity of 1 W/mm$^2$, light intensity detected by the photosensitive element of the image sensor is 0.001 W/mm$^2$, it can be seen that ambient light is basically shielded; when the light shielding matrix is not provided, the signal light emitted from the plurality of light sources 101 and reflected by the texture to the plurality of image sensors 102 is simulated; in this case, the intensity of the signal light detected by the photosensitive element of the image sensor is 1 W/mm$^2$; when the light shielding matrix is provided, the intensity of the signal light detected by the photosensitive element of the image sensor is still 1 W/mm$^2$, it can be seen that the light shielding matrix does not shield the signal light. Thus, it can be concluded that the light shielding matrix does not shield the signal light while avoiding interference of ambient light, which further ensures the intensity of the signal light.

Figure 5:
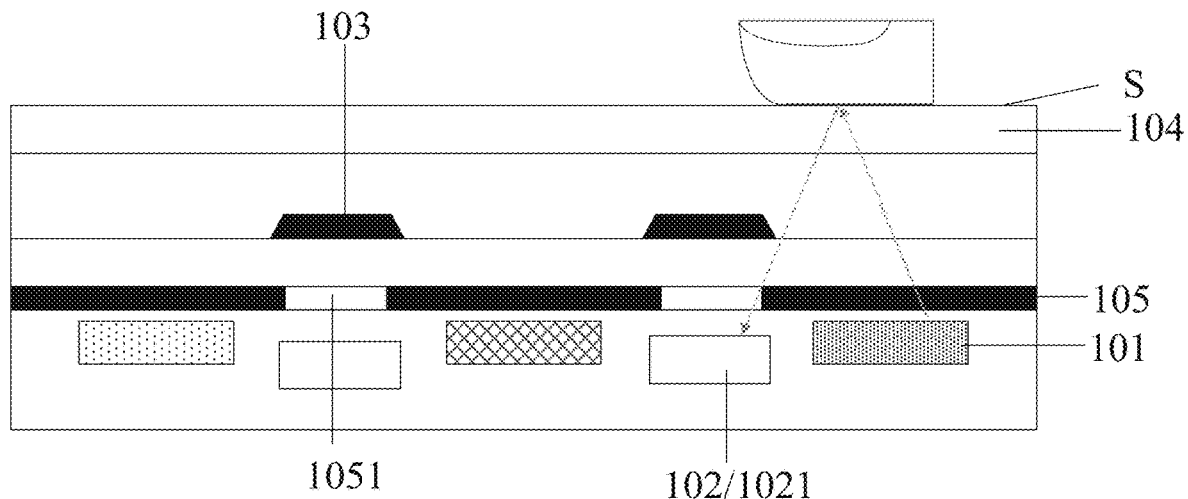
FIG. 5 is a cross-sectional schematic diagram of another texture recognition apparatus provided by at least one embodiment of the present disclosure.

For example, in other embodiments, as shown in FIG. 5, the texture recognition apparatus may further include a light shielding layer 105 between the light shielding matrix and the image sensor array; the light shielding layer 105 includes a plurality of first openings 1051; in the direction perpendicular to the touch side surface S, that is, in the vertical direction in the figure, a photosensitive element 1021 of each of the plurality of image sensors 102 at least partially overlaps with at least one of the plurality of first openings 1051, and the plurality of light shielding patterns 103 are in one-to-one correspondence and at least partially overlap with the plurality of first openings 1051. That is, a photosensitive element 1021 of each image sensor 102 is correspondingly provided with the same number of light shielding patterns 103 and first openings 1051. Thus, the light shielding layer 105 may further shield ambient light, and signal light may be incident on the photosensitive element 1021 of the image sensor 102 through the plurality of first openings 1051 for texture collection.

For example, in some embodiments, with respect to one photosensitive element 1021 and at least one first opening 1051 that are provided correspondingly, an orthogonal projection of the at least one first opening 1051 on a plane where the photosensitive element 1021 is located is located inside the photosensitive element 1021, that is, in the direction perpendicular to the touch side surface S, the at least one first opening 1051 exposes the photosensitive element 1021, so that signal light passing through the at least one first opening 1051 can sufficiently irradiate on the photosensitive element 1021.

Figure 6:
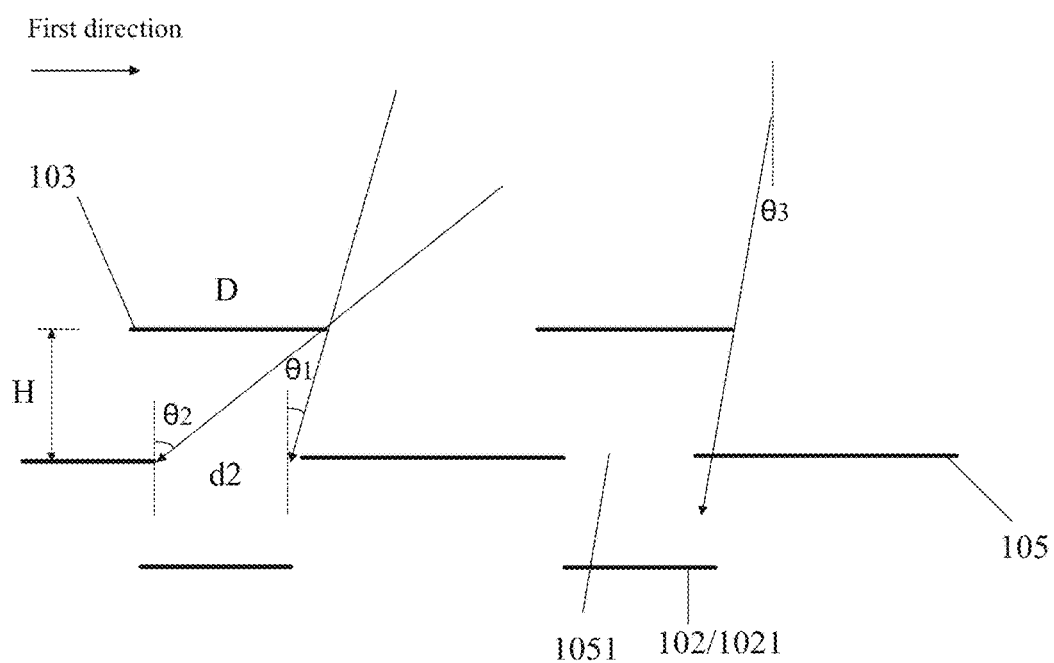
FIG. 6 is a schematic diagram of a texture recognition optical path in another texture recognition apparatus provided by at least one embodiment of the present disclosure.

For example, in some embodiments, a photosensitive element 1021 of each of the plurality of image sensors 102 at least partially overlaps with one of the plurality of first openings 1051, and the plurality of light shielding patterns 103 are in one-to-one correspondence and at least partially overlap with the plurality of first openings 1051; as shown in FIG. 6, with respect to one light shielding pattern 103 and one first opening 1051 that are arranged correspondingly, in the first direction parallel to the touch side surface S, a length of the light shielding pattern 103 is D, a length of the first opening 1051 is d2; and in the direction perpendicular to the touch side surface S, a distance from the light shielding pattern 103 to the light shielding layer 105 is H, then:

$$D=d2+2H\times \tan\theta 1,$$

Where θ1 is a minimum critical angle of the optical path for texture recognition, the above-described embodiments may be referred to for specific introduction and examples of θ1, and no details will be repeated here. Thus, a size relationship between D, d2 and H can be obtained according to the above formula.

For example, in some embodiments, a planar shape of the first opening 1051 is a circle, a square or a rectangle; in a case where the planar shape of the first opening 1051 is a circle, a diameter of the circle is d2, and 2 microns≤d2≤12.8 microns, for example, d2 is 2 microns, 4 microns, 7 microns or 10 microns, etc.; or in a case where the planar shape of the first opening 1051 is a square or a rectangle, a side length of the square or a length or a width of the rectangle extends along the above-described first direction, and the side length of the square or the length or the width of the rectangle is d2, and 2 microns≤d2≤12.8 microns, for example, d2 is 2 microns, 4 microns, 7 microns or 10 microns, etc. Under the above-described size range of the first opening 1051, the first opening 1051 can sufficiently transmit signal light.

For example, in some embodiments, in order to facilitate arrangement of devices inside the texture recognition apparatus and formation of a signal optical path for texture recognition, a range of the distance H from the light shielding pattern 103 to the light shielding layer 105 is: 4 microns≤H≤6 microns, for example, H is 4 microns or 5 microns, etc. For example, in some examples, a size range of the first opening 1051 is 2 microns≤d2≤12.8 microns, and H is 4 microns, in this case, a length range of the light shielding pattern 103 is 9.2 microns≤D≤20 microns.

Figure 7:
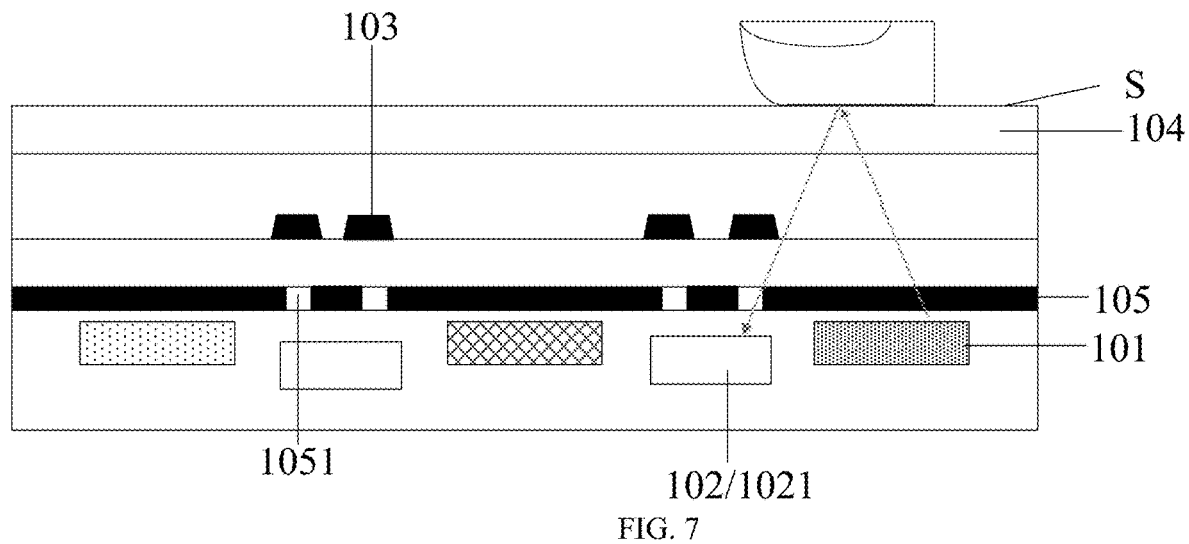
FIG. 7 is a cross-sectional schematic diagram of further another texture recognition apparatus provided by at least one embodiment of the present disclosure.
Figure 8:
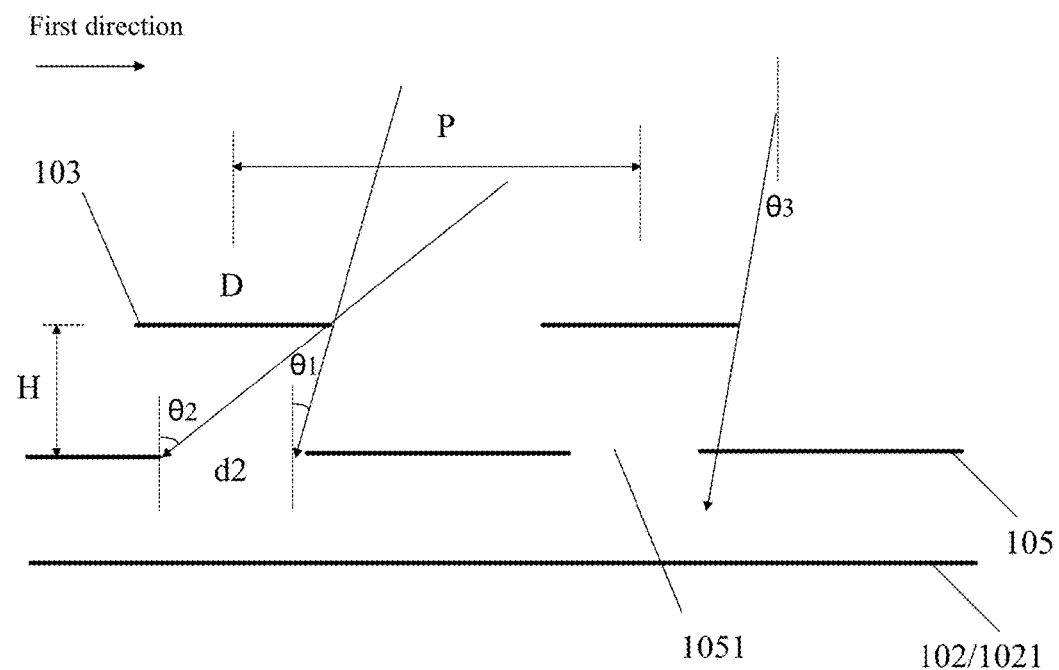
FIG. 8 is a schematic diagram of a texture recognition optical path in further another texture recognition apparatus provided by at least one embodiment of the present disclosure.

For example, in other embodiments, as shown in FIG. 7, a photosensitive element 1021 of each of the plurality of image sensors 102 at least partially overlap with at least two of the plurality of first openings 1051 (shown as two first openings in the figure); and the plurality of light shielding patterns 103 are in one-to-one correspondence and at least partially overlap with the plurality of first openings 1051. As shown in FIG. 8, with respect to one photosensitive element 1021, at least two first openings 1051 and at least two light shielding patterns 103 that are arranged correspondingly, in the first direction parallel to the touch side surface S, a length of the light shielding pattern 103 is D, a distance between two adjacent light shielding patterns 103 (i.e., a distance between centers of two adjacent light shielding patterns 103) is P, a length of the first opening 1051 is d2; and in the direction perpendicular to the touch side surface S, a distance from the light shielding pattern 103 to the light shielding layer 105 is H, then:

$$D=d2+2H\times \tan\theta 1,$$

$$P=H\times (\tan\theta 1+\tan\theta 2),$$

Where θ1 is a minimum critical angle of the optical path for texture recognition, and θ2 is a maximum critical angle of the optical path for texture recognition. The above-described embodiments may be referred to for specific introduction and examples of θ1 and θ2, and no details will be repeated here. Thus, a size relationship between D, d2, P and H can be obtained according to the above formula.

For example, in some embodiments, a planar shape of the first opening 1051 is a circle, a square or a rectangle; in a case where the planar shape of the first opening 1051 is a circle, a diameter of the circle is d2, and 2 microns≤d2≤12.8 microns, for example, d2 is 2 microns, 4 microns, 7 microns or 10 microns, etc.; or in a case where the planar shape of the first opening 1051 is a square or a rectangle, a side length of the square or a length or a width of the rectangle extends along the above-described first direction, and therefore the side length of the square or the length or the width of the rectangle is d2, and 2 microns≤d2≤12.8 microns, for example, d2 is 2 microns, 4 microns, 7 microns or 10 microns, etc. Under the above-described size range of the first opening 1051, the first opening 1051 can sufficiently transmit signal light.

For example, in some embodiments, in order to facilitate arrangement of devices inside the texture recognition apparatus and formation of the signal optical path for texture recognition, a range of the distance H from the light shielding pattern 103 to the light shielding layer 105 is: 4 microns≤H≤6 microns, for example, H is 4 microns or 5 microns etc.

For example, in some examples, a size range of the first opening 1051 is 2 microns≤d2≤12.8 microns, and H is 4 microns, then a length range of the light shielding pattern 103 is 9.2 microns≤D≤20 microns. A distance P between two adjacent light shielding patterns 103 is 14.6 microns. In this case, a size of the photosensitive element 1021 of the image sensor 102 may be set to be greater, for example, a side length ranges from 100 microns to 200 microns, so as to sufficiently receive signal light to form a larger texture image.

For example, in one example, a size of the first opening 1051 is 2 microns, H is 4 microns, the length of the light shielding pattern 103 is 9.2 microns, and the distance P between two adjacent light shielding patterns 103 is 14.6 microns.

An optical simulation test is performed on the texture recognition apparatus of the above-described example, and a result shows that when simulated ambient light enters the texture recognition apparatus with intensity of 1 W/mm$^2$, light intensity detected by the photosensitive element of the image sensor is 0 W/mm$^2$, it can be seen that the ambient light is completely shielded; when the light shielding matrix and the light shielding layer are not provided, the signal light emitted from the plurality of light sources 101 and reflected by the texture to the plurality of image sensors 102 is simulated; in this case, the intensity of the signal light detected by the photosensitive element of the image sensor is 1 W/mm$^2$; when the light shielding matrix and the light shielding layer are provided, the intensity of the signal light detected by the photosensitive element of the image sensor is still 1 W/mm$^2$, it can be seen that the light shielding matrix and the light shielding layer do not shield the signal light.

Thus, it can be concluded that the light shielding matrix and the light shielding layer do not shield the signal light while avoiding interference of ambient light, which further ensures the intensity of the signal light.

Figure 9:
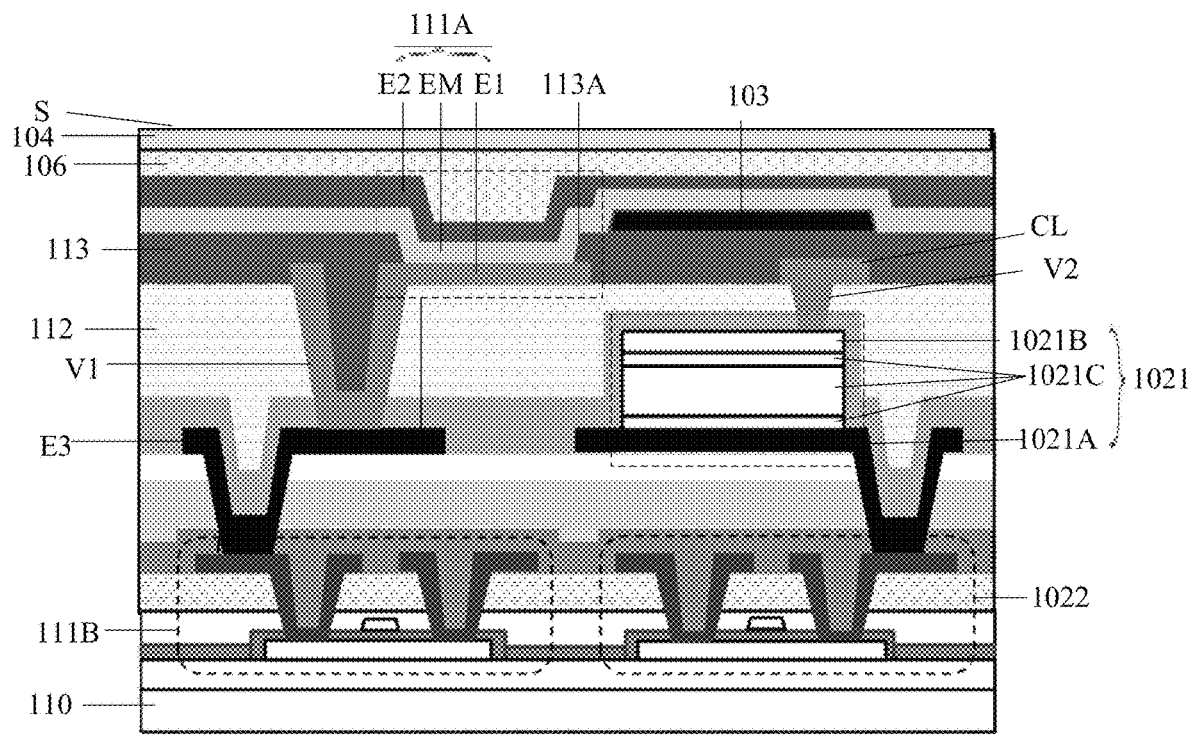
FIG. 9 is a cross-sectional schematic diagram of a display apparatus provided by at least one embodiment of the present disclosure.
Figure 10A:
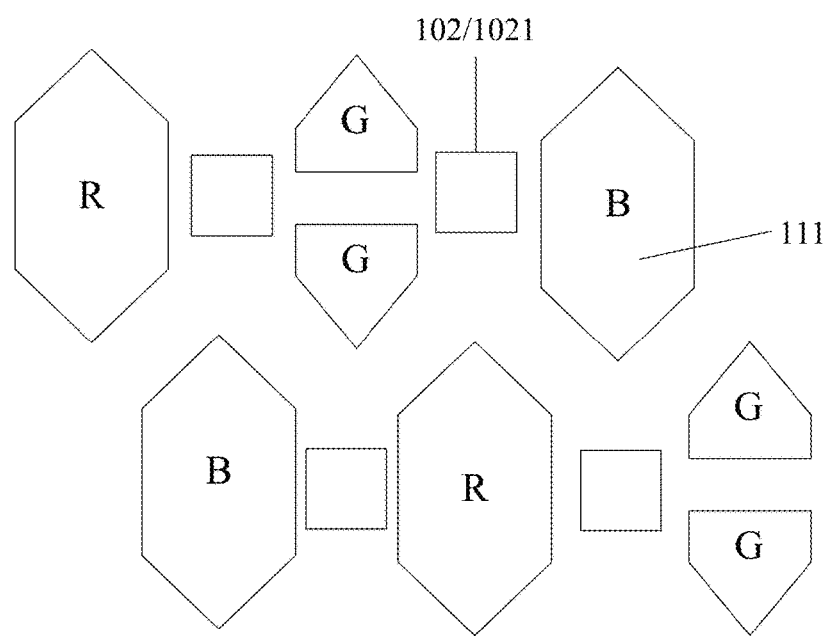
FIG. 10A is a schematic plan view of a sub-pixel array and an image sensor array in a display apparatus provided by at least one embodiment of the present disclosure.
Figure 10B:
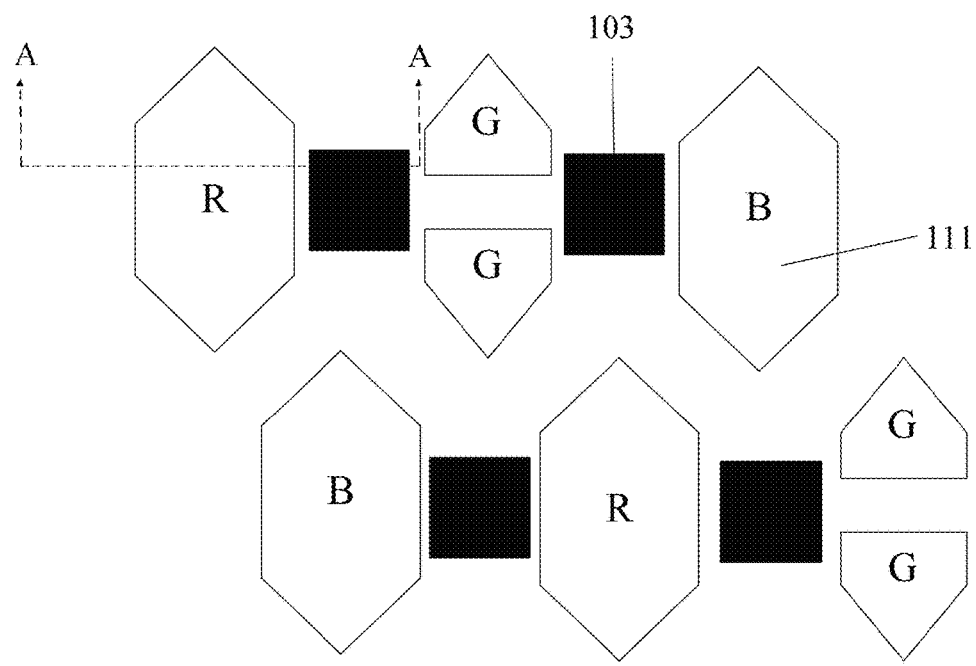
FIG. 10B is a schematic plan view of a sub-pixel array and a light shielding matrix in a display apparatus provided by at least one embodiment of the present disclosure.

For example, in some embodiments, the texture recognition apparatus is, for example, a display apparatus having an under-screen texture recognition function, and accordingly includes a display panel. FIG. 9 shows a partial cross-sectional schematic diagram of the display apparatus; FIG. 10A shows a partial schematic plan view of the display apparatus; and FIG. 10B shows a partial schematic plan view after the display apparatus is provided with a light shielding matrix. For example, FIG. 9 is a sectional view taken along a line A-A in FIG. 10B.

For example, as shown in FIG. 9, FIG. 10A and FIG. 10B, the display panel includes an array substrate; the array substrate includes a base substrate 110 and a sub-pixel array provided on the base substrate 110; and the sub-pixel array includes a plurality of sub-pixels 111. For example, the light source array includes the sub-pixel array, the plurality of light sources includes the plurality of sub-pixels 111, and therefore the sub-pixel array is further used as the light source array; and the plurality of sub-pixels 111 are further used as the plurality of light sources. That is, at least some of the sub-pixels 111 of the display panel are further used as the light sources 101, so that the compactness of the display apparatus can be improved and the arrangement difficulty of respective functional structures can be reduced.

For example, one or more of the plurality of sub-pixels 111 may be lit up (to emit light) simultaneously for forming a photosensitive light source having a certain shape, for example, forming a point light source, a line light source, or other patterned light source. For example, in some examples, a plurality of sub-pixels 111 arranged in a 7×7 array (i.e., an array arranged in 7 rows and 7 columns) may be lit up simultaneously for forming a point-shaped photosensitive light source; for example, a plurality of sub-pixels 111 arranged in an 8×8 array (i.e., an array arranged in 8 rows and 8 columns) may be lit up at intervals for forming a point-shaped photosensitive light source with low brightness; for another example, a plurality of sub-pixels 111 arranged in a 3×7 array (i.e., an array arranged in 3 rows and 7 columns) may be lit up simultaneously for forming a line-shaped photosensitive light source, etc. a specific mode for lighting up the plurality of sub-pixels 111 to form the photosensitive light source is not limited by the embodiments of the present disclosure.

For example, the sub-pixels 111 in the entire display region of the display panel may be controlled to be further used as the light sources 101; and the image sensor array may also be correspondingly arranged below the entire display region, so as to implement full-screen texture recognition.

For example, in other embodiments, a display apparatus having an under-screen texture recognition function includes a display panel and separately provided light-emitting elements serving as the photosensitive light source for implementing texture recognition; these light-emitting elements are, for example, arranged between adjacent sub-pixels in the sub-pixel array, or overlapped with the sub-pixels, which is not limited by the embodiments of the present disclosure.

For example, as shown in FIG. 10A and FIG. 10B, the plurality of sub-pixels 111 include a plurality of sub-pixels of different colors; for example, the plurality of sub-pixels 111 include a red sub-pixel R, a blue sub-pixel B, and a green sub-pixel G; one red sub-pixel R, one blue sub-pixel B and two green sub-pixels G constitute a pixel unit; and the two green sub-pixels G are arranged separately between the red sub-pixel R and the blue sub-pixel B that are adjacent to each other. For example, as shown in FIG. 10A, the photosensitive element 1021 of each image sensor 102 is arranged between adjacent sub-pixels; as shown in FIG. 10B, after the light shielding matrix is provided, in the direction perpendicular to the touch side surface S, the plurality of light shielding patterns 103 respectively shield the photosensitive elements 1021 of the plurality of image sensors 102, so that the plurality of light shielding patterns 103 are also correspondingly provided between adjacent sub-pixels 111.

For example, as shown in FIG. 9, each of the plurality of sub-pixels 111 includes a pixel driving circuit provided on the base substrate 110; the pixel driving circuit includes a thin film transistor 111B; each of the plurality of image sensors 102 further includes a switch transistor 1022 provided on the base substrate 110; and the thin film transistor 111B and the switch transistor 1022 are arranged in the same layer.

For example, the thin film transistor 111B includes structures such as an active layer, a gate electrode, and source-drain electrodes; the switch transistor 1022 also includes structures such as an active layer, a gate electrode, and source-drain electrodes; for example, the active layer, the gate electrode, and the source-drain electrodes of the thin film transistor 111B are arranged in one-to-one correspondence with and in the same layer as the active layer, the gate electrode, and the source-drain electrodes of the switch transistor 1022, or at least some functional layers of the thin film transistor 111B and the switch transistor 1022 are arranged in the same layer, so as to simplify a preparation process of the display substrate.

It should be noted that, in the embodiments of the present disclosure, "in a/the same layer" refers to that two functional layers or structural layers are formed in the same layer and with the same material in the hierarchical structure of the display substrate, that is, in the preparation process, the two functional layers or structural layers are formed by the same material layer, and desired patterns and structures may be formed by the same patterning process.

For example, the active layer may be an amorphous silicon layer, a polysilicon layer, or a metal oxide semiconductor layer. For example, polysilicon may be high-temperature polysilicon or low-temperature polysilicon; and the oxide semiconductor may be indium gallium zinc oxide (IGZO), indium zinc oxide (IZO), zinc oxide (ZnO), gallium zinc oxide (GZO), or the like. The respective gate electrodes may adopt metal materials such as copper (Cu), aluminum (Al), titanium (Ti) or alloy materials, for example, may be formed into a single-layer metal layer structure or a multi-layer metal layer structure, for example, a multi-layer metal layer structure of titanium/aluminum/titanium. The respective source-drain electrodes may adopt metal materials such as copper (Cu), aluminum (Al), titanium (Ti) or alloy materials, for example, may be formed into a single-layer metal layer structure or a multi-layer metal layer structure, for example, a multi-layer metal layer structure of titanium/aluminum/titanium.

For example, as shown in FIG. 9, the photosensitive element 1021 is provided on a side of the switch transistor 1022 away from the base substrate 110, and includes a first electrode 1021A, a second electrode 1021B and a semiconductor layer 1021C between the first electrode 1021A and the second electrode 1021B; the first electrode 1021A is electrically connected with the switch transistor 1022, so that the switch transistor 1022 can control a voltage applied to the first electrode 1021A, and further control an operation state of the photosensitive element 1021.

For example, the photosensitive element 1021 may be a PN photodiode or a PIN photodiode, etc., in this case, the semiconductor layer 1021C includes a P-type semiconductor layer and an N-type semiconductor layer (e.g., an N-type Si layer) that are stacked, or includes a P-type semiconductor layer (e.g., a P-type Si layer), an intrinsic semiconductor layer (e.g., an intrinsic Si layer), and an N-type semiconductor layer (e.g., an N-type Si layer) that are stacked. For example, the second electrode 1021B is a transparent electrode, which may be made of a material such as a transparent metal oxide, such as indium tin oxide (ITO), indium zinc oxide (IZO), or gallium zinc oxide (GZO). The first electrode 1021A is a metal electrode, and is made of a metal material such as copper (Cu), aluminum (Al), and titanium (Ti) or an alloy material.

For example, the array substrate further includes a planarization layer 112 provided on a side of the photosensitive element 1021 away from the base substrate 110; and the planarization layer 112 has a first via V1 and a second via V2 therein. Each of the plurality of sub-pixels 111 further includes a light-emitting device 111A; and the light-emitting device 111A is provided on a side of the planarization layer 112 away from the base substrate 110. The light-emitting device 111A includes a first light emission driving electrode E1, a second light emission driving electrode E2, and a light-emitting layer EM between the first light emission driving electrode E1 and the second light emission driving electrode E2; the first light emission driving electrode E1 is electrically connected with the thin film transistor 111B at least through the first via V1. The array substrate further includes a connecting line CL provided in the same layer as the first light emission driving electrode E1; and the connecting line CL is electrically connected with the second electrode 1021B of the photosensitive element 1021 through the second via V2.

For example, the planarization layer 112 may be made of an organic insulating material such as polyimide or resin; the first light emission driving electrode E1 may be made of a transparent metal oxide such as indium tin oxide (ITO), indium zinc oxide (IZO), and gallium zinc oxide (GZO); and the second light emission driving electrode E2 may be made of a metal material such as lithium (Li), aluminum (Al), magnesium (Mg), and silver (Ag).

For example, the array substrate further includes a connecting electrode E3; the connecting electrode E3 is provided in the same layer as the first electrode 1021A of the photosensitive element 1021; the first light emission driving electrode E1 is electrically connected with the connecting electrode E3 through the first via V1; and the connecting electrode E3 is electrically connected with the thin film transistor 111B, to further implement electrical connection between the first light emission driving electrode E1 and the thin film transistor 111B.

For example, the array substrate further includes a pixel definition layer 113 provided on a side of the first light emission driving electrode E1 and the connecting line CL away from the base substrate 110; the pixel definition layer 113 has a second opening 113A exposing the first light emission driving electrode E1; and the light-emitting layer EM and the second light emission driving electrode E2 are respectively at least partially formed in the second opening 113A. For example, the light shielding matrix is provided on a side of the pixel definition layer 113 away from the base substrate 110.

For example, the plurality of light shielding patterns 103 included in the light shielding matrix can further play a role of a spacer in the display panel, that is, the light shielding matrix simultaneously implements a light shielding function and a function of a spacer, so that the display panel may no longer be additionally provided with a spacer, so as to simplify the structure and a fabrication process of the display panel. For example, the light shielding matrix may be a black matrix including an organic resin material doped with black pigment.

For example, when ambient light irradiates directly above the finger, the ambient light may pass through the finger and excite biological tissue in the finger to emit pigment light, which may interfere with fingerprint recognition. Through detection, the pigment light mainly includes light with a wavelength greater than 600 nm.

For example, in some embodiments, the pixel definition layer 113 is configured to filter light with a wavelength greater than 600 nm, e.g., filter light with a wavelength of 600 nm to 900 nm, that is, prevent light with the wavelength of 600 nm to 900 nm from passing through. For example, a material of the pixel definition layer 113 includes an organic resin material doped with a colored dye, so that the pixel definition layer 113 has a certain filtering effect on light with the wavelength of 600 nm to 900 nm. The colored dye includes, for example, a bromoamino acid derivative, or the like. Therefore, the cooperation of the light shielding matrix and the pixel definition layer 113 can avoid influence of ambient light on the image sensor while ensuring transmitting of signal light, so as to improve accuracy of texture recognition.

Figure 11:
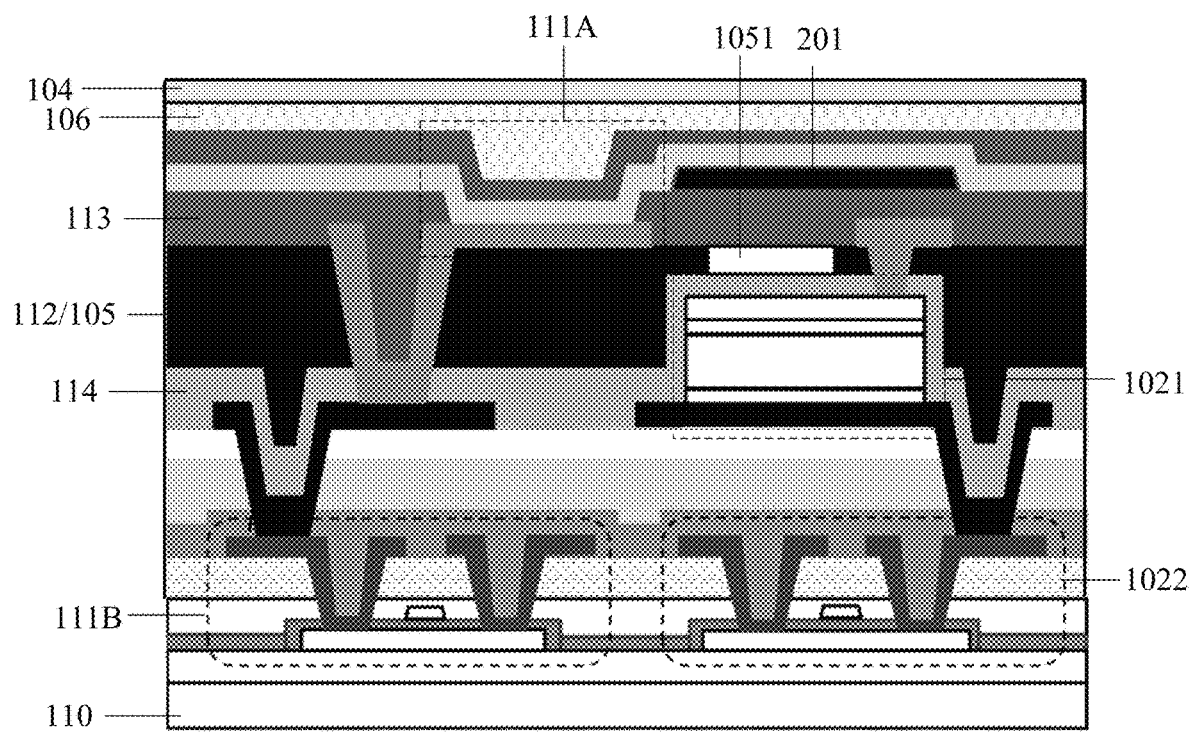
FIG. 11 is a cross-sectional schematic diagram of another display apparatus provided by at least one embodiment of the present disclosure.

For example, in some embodiments, in a case where the display apparatus further has the light shielding layer 105 similar to that shown in FIG. 5, the planarization layer 112 on the array substrate may be configured to include the light shielding layer 105. For example, as shown in FIG. 11, the planarization layer 112 may be integrally fabricated as a light shielding layer. For example, the planarization layer 112 is made of an organic resin material doped with black pigment to form the light shielding layer.

As shown in FIG. 11, the planarization layer 112 has a first opening 1051 above the photosensitive element 1021 of the image sensor 102 to transmit signal light. For example, in some examples, a surface of the photosensitive element 1021 is further covered with a passivation layer 114, the passivation layer 114 is made of a transparent insulating material, so it will not affect transmitting of the signal light.

For example, the first opening 1051 is filled with a transparent insulating material. For example, the transparent insulating material may be the same as the material of the pixel definition layer 113, so the transparent insulating material filling the first openings 1051 may be formed while the pixel definition layer 113 is formed. For example, the transparent insulating material is a transparent organic material such as polyimide, resin or the like.

Figure 12:
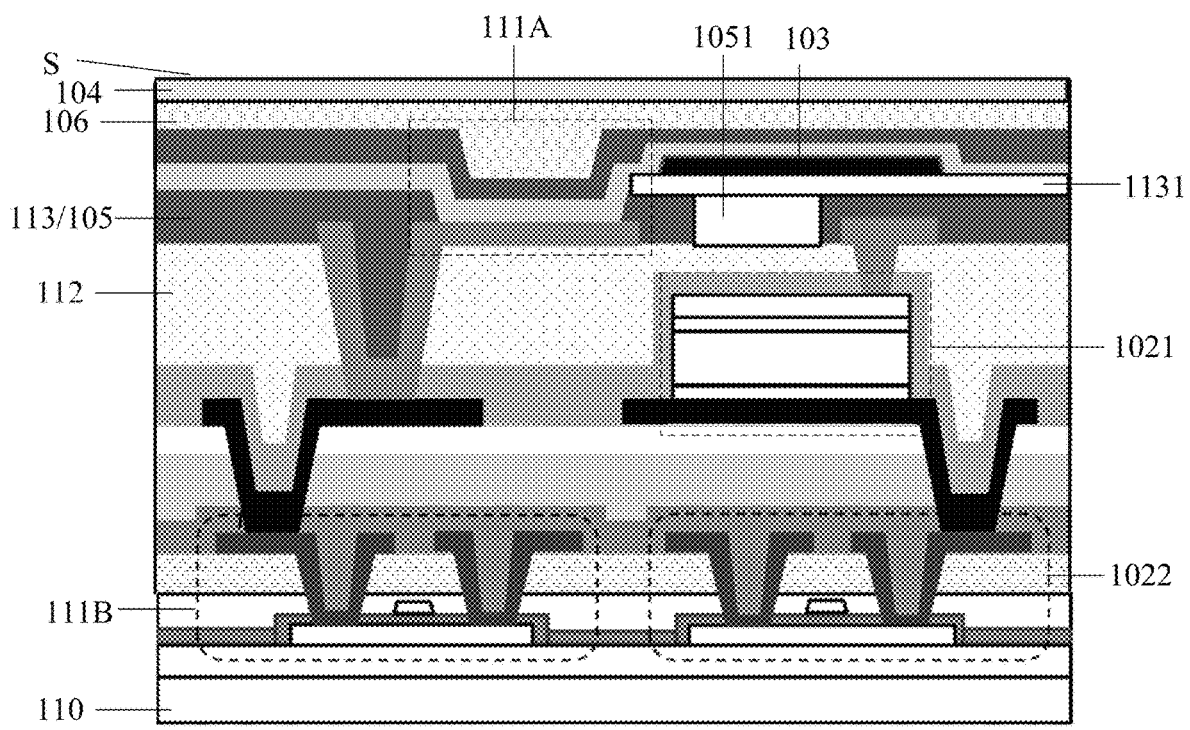
FIG. 12 is a cross-sectional schematic diagram of further another display apparatus provided by at least one embodiment of the present disclosure.

Or, in some embodiments, as shown in FIG. 12, the pixel definition layer 113 is configured to include a light shielding layer 105. For example, the pixel definition layer 113 may be integrally fabricated as a light shielding layer. For example, the pixel definition layer 113 is made of an organic resin material doped with black pigment to form the light shielding layer.

As shown in FIG. 12, the pixel definition layer 113 has a first opening 1051 above the photosensitive element 1021 of the image sensor 102 to transmit signal light. For example, a spacer insulating layer 1131 is further provided on the pixel definition layer 113 to separate the pixel definition layer 113 from the light shielding pattern 103 by a certain distance.

For example, the spacer insulating layer 1131 is made of a transparent insulating material, and a material of the spacer insulating layer 1131 is filled in the first opening 1051. For example, the transparent insulating material is a transparent organic material such as polyimide, resin, or the like.

Figure 13:
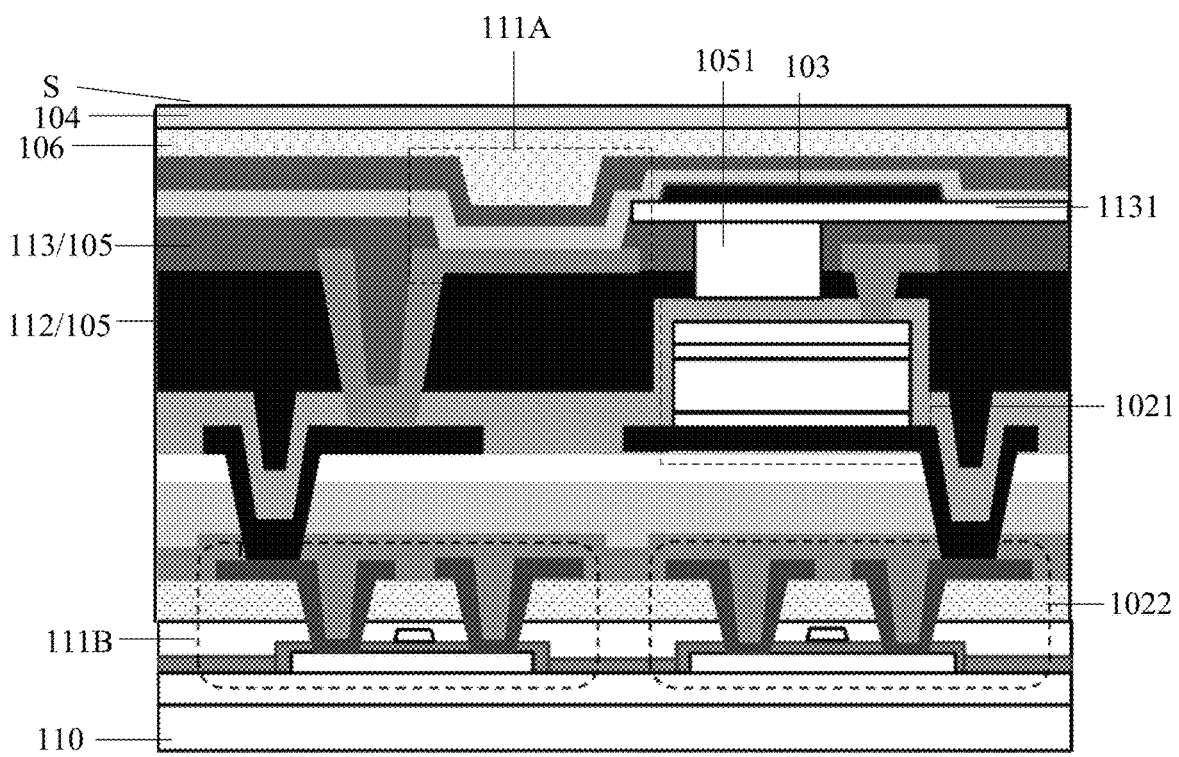
FIG. 13 is a cross-sectional schematic diagram of yet another display apparatus provided by at least one embodiment of the present disclosure.

Or, in some embodiments, as shown in FIG. 13, both the planarization layer 112 and the pixel definition layer 113 are configured to include a light shielding layer. For example, the planarization layer 112 and the pixel definition layer 113 are both made of an organic resin material doped with black pigment to form light shielding layers.

As shown in FIG. 13, the planarization layer 112 and the pixel definition layer 113 have first openings 1051 running through each other above the photosensitive element 1021 of the image sensor 102 to transmit signal light. For example, a spacer insulating layer 1131 is further provided on the pixel definition layer 113 to separate the pixel definition layer 113 from the light shielding pattern 103 by a certain distance.

Figure 14A:
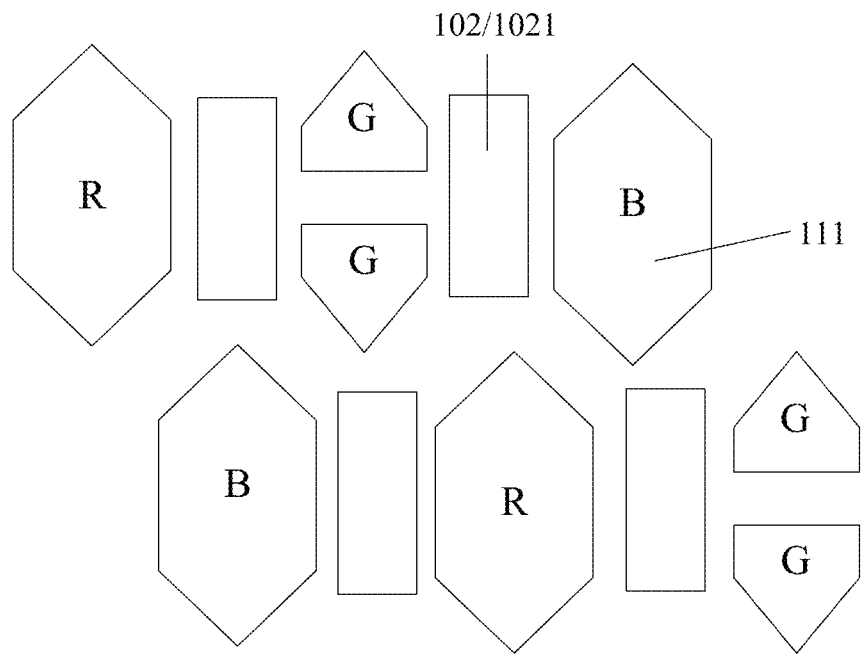
FIG. 14A is a schematic plan view of a sub-pixel array and an image sensor array in a display apparatus provided by at least one embodiment of the present disclosure.
Figure 14B:
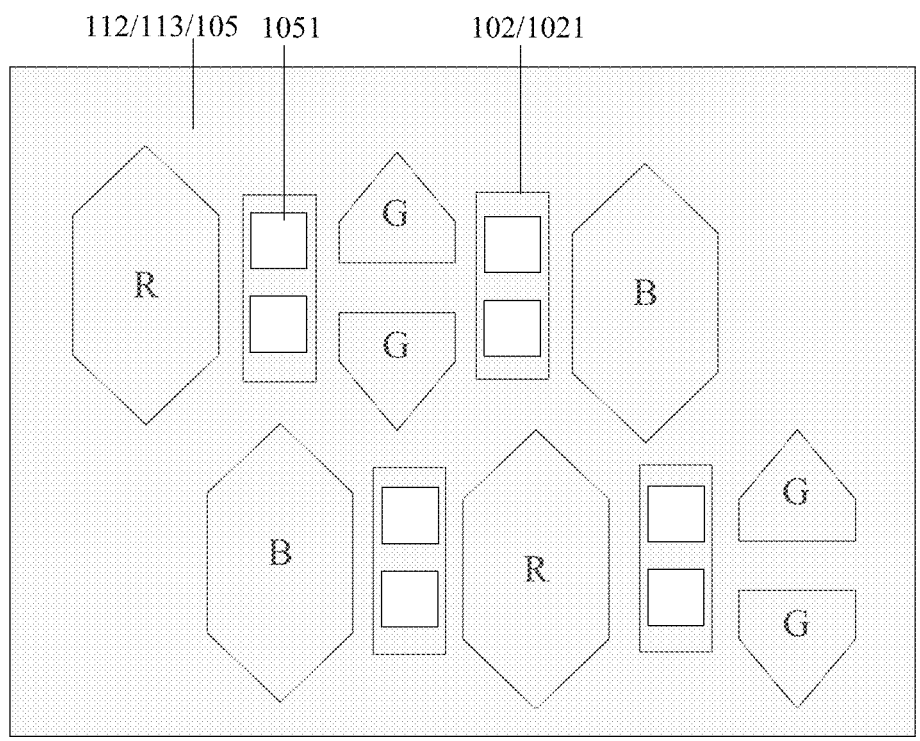
FIG. 14B is a schematic plan view of a sub-pixel array, an image sensor array and a light shielding layer in a display apparatus provided by at least one embodiment of the present disclosure.
Figure 14C:
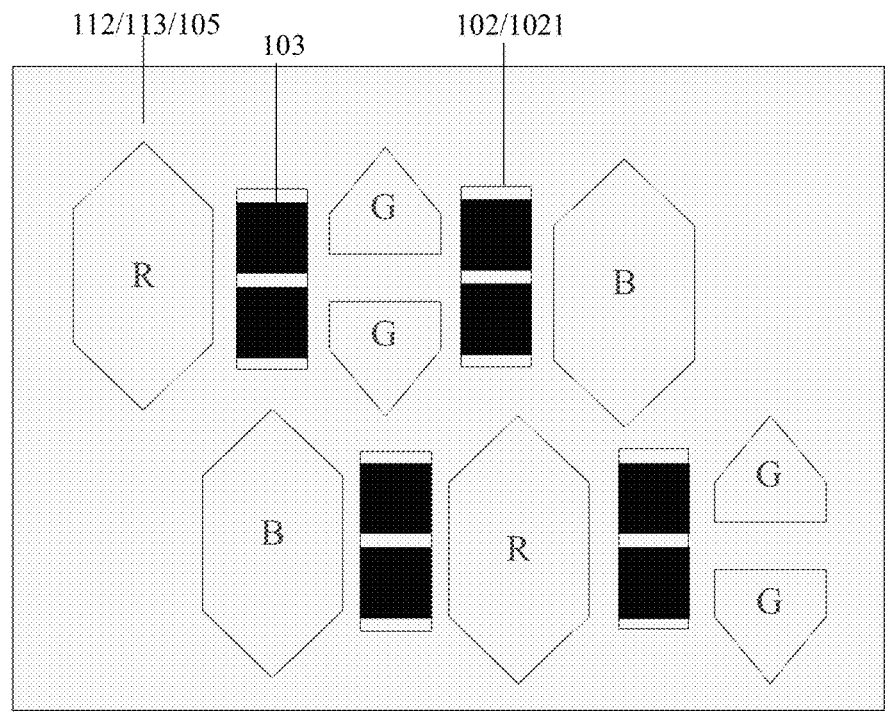
FIG. 14C is a schematic plan view of a sub-pixel array, an image sensor array, a light shielding layer, and a light shielding matrix in a display apparatus provided by at least one embodiment of the present disclosure.

For example, FIG. 14A shows a schematic plan view of a plurality of sub-pixels and an image sensor array; FIG. 14B shows a schematic plan view after the light shielding layer is provided on the image sensor array, and FIG. 14C shows a schematic plan view after the light shielding matrix is provided on the light shielding layer. In FIG. 14A to FIG. 14C, in the example, the photosensitive element 1021 of each image sensor 102 is in a rectangular shape; and one photosensitive element 1021 is correspondingly provided with two first openings 1051 and two light shielding patterns 103. In the plan view, the first opening 1051 and the light shielding pattern 103 are both in square shapes; and the photosensitive element 1021, the first opening 1051 and the light shielding pattern 103 are all arranged between adjacent sub-pixels 111, so that the display effect of the sub-pixel array will not be affected.

Figure 15:
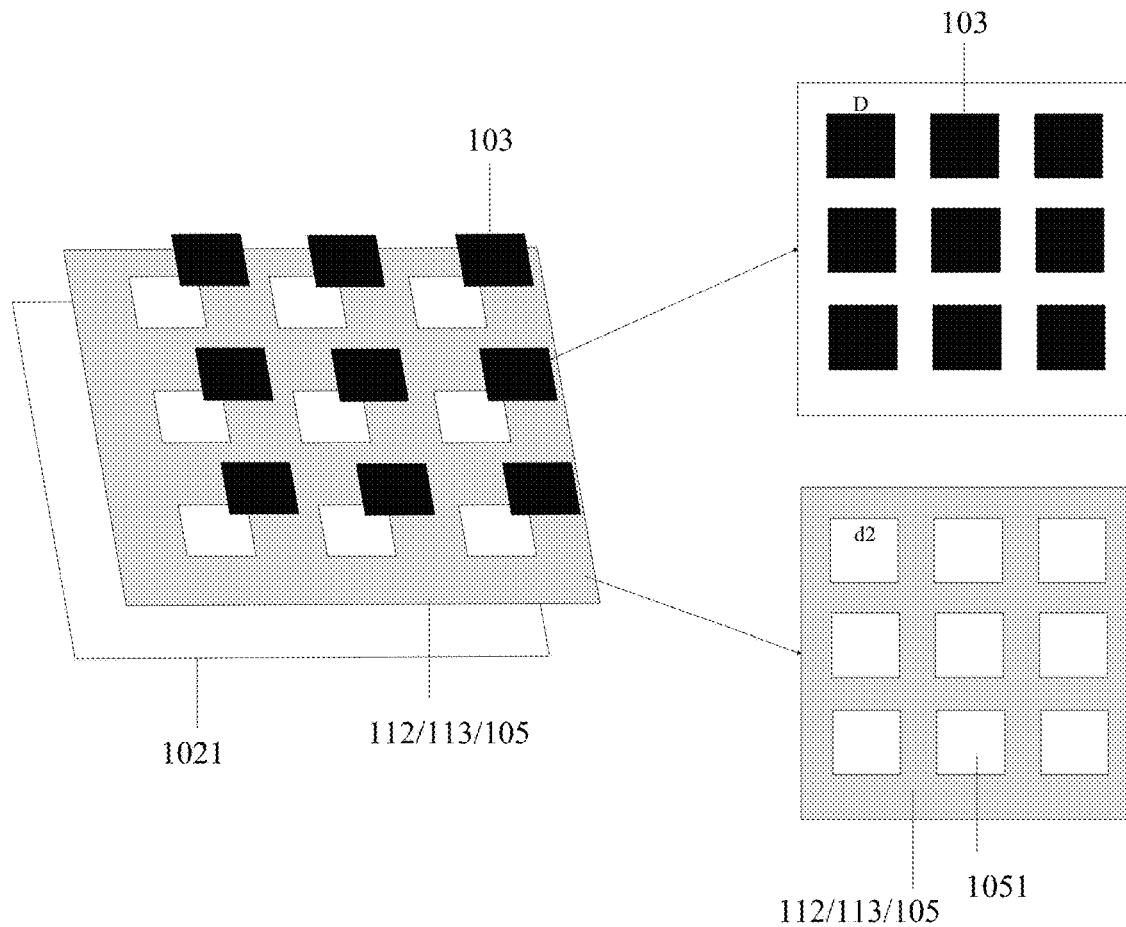
FIG. 15 is a schematic plan view of a photosensitive element, a light shielding layer and a light shielding pattern between adjacent sub-pixels in a display apparatus provided by at least one embodiment of the present disclosure.

For example, in other embodiments, the photosensitive element 1021 of the image sensor 102 between adjacent sub-pixels 111 may also be in a square shape. For example, in the example shown in FIG. 15, one photosensitive element 1021 is correspondingly provided with 9 first openings 1051 and 9 light shielding patterns 103 arranged in an array; and all the first openings 1051 and the light shielding patterns 103 are in square shapes.

For example, the embodiments shown in FIG. 2 to FIG. 8 above may be referred to for a size of the photosensitive element 1021, a size d2 of the first opening 1051, and a size D of the light shielding pattern 103 in each display apparatus in FIG. 9 to FIG. 15, and no details will be repeated here.

For example, the display panel included in the display apparatus may be an organic light emitting diode (OLED) display panel or a quantum dot light emitting diode (QLED) display panel, etc., which is not specifically limited by the embodiments of the present disclosure. The OLED display panel may be, for example, a flexible OLED display panel. For example, the OLED display panel and the QLED display panel have self-luminous properties, and luminescence of display pixel units thereof may also be controlled or modulated as required, which may facilitate the texture collection and help improve device integration.

For example, in addition to the sub-pixel array, the display panel further includes signal lines (including gate lines, data lines, detection lines, etc.) for supplying electrical signals (including scan signals, data signals, detection signals, etc.), for example, a luminous state of the light-emitting device may be controlled by a driving circuit to implement lighting up of the sub-pixels. For example, the display panel may further have other functional layers such as an encapsulation layer 106 and a touch layer; and related art may be referred to for these functional layers, and no details will be repeated here.

At least one embodiment of the present disclosure further provides an electronic apparatus; the electronic apparatus includes any one of the above-described texture recognition apparatuses. The electronic apparatus may be a mobile phone, a tablet personal computer, a monitor, a laptop, and any other product or component having a texture recognition function, which is not specifically limited by the embodiments of the present disclosure.

The following statements should be noted.

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. It should be understood that, in the case in which a component such as a layer, film, region, substrate or the like is referred to be "on" or "under" another component, it may be directly on or under the another component or a component is interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A texture recognition apparatus, having a touch side surface, and comprising:
a light source array, comprising a plurality of light sources;
an image sensor array, comprising a plurality of image sensors, wherein the plurality of image sensors are configured to be able to receive light emitted from the plurality of light sources and reflected by a texture to the plurality of image sensors for texture image collection,
a light shielding matrix, on a light incident side of the image sensor array, comprising a plurality of light shielding patterns arranged in an array,
wherein each of the plurality of image sensors comprises a photosensitive element; in a direction perpendicular to the touch side surface, the plurality of light sources do not overlap with the plurality of light shielding patterns; and a photosensitive element of each of the plurality of image sensors at least partially overlaps with at least one of the plurality of light shielding patterns, and
the texture recognition apparatus further comprising a light shielding layer between the light shielding matrix and the image sensor array, wherein the light shielding layer comprises a plurality of first openings,
in the direction perpendicular to the touch side surface, a photosensitive element of each of the plurality of image sensors at least partially overlaps with at least two of the plurality of first openings; and the plurality of light shielding patterns are in one-to-one correspondence and at least partially overlap with the plurality of first openings.

2. The texture recognition apparatus according to claim 1, wherein the photosensitive element of each of the plurality of image sensors at least partially overlaps with one of the plurality of light shielding patterns,
with respect to one light shielding pattern and a photosensitive element of one image sensor that are provided correspondingly, an orthogonal projection of the photosensitive element on a plane where the one light shielding pattern is located is located inside the light shielding pattern.

3. The texture recognition apparatus according to claim 2, wherein in a first direction parallel to the touch side surface, a length of the light shielding pattern is D, a length of the photosensitive element is d1; and in the direction perpendicular to the touch side surface, a distance from the light shielding pattern to the photosensitive element is h, then:

$$D=d1+2h\times\tan\theta1,$$

where θ1 is a minimum critical angle of an optical path for texture recognition.

4. The texture recognition apparatus according to claim 3, wherein a planar shape of the photosensitive element is a square or a rectangle;
a side length of the square or a length or a width of the rectangle extends along the first direction, so that the side length of the square or the length or the width of the rectangle is d1, and $$10 \text{ microns} \leq d1 \leq 20 \text{ microns}.$$

5. The texture recognition apparatus according to claim 4, wherein a range of a distance h from the light shielding pattern to the photosensitive element is: 3 microns≤h≤5 microns.

6. The texture recognition apparatus according to claim 1, wherein with respect to one photosensitive element and at least one first opening that are provided correspondingly, an orthogonal projection of the at least one first opening on a plane where the photosensitive element is located is located inside the photosensitive element.

7. The texture recognition apparatus according to claim 6, wherein a photosensitive element of each of the plurality of image sensors at least partially overlaps with one of the plurality of first openings; and the plurality of light shielding patterns are in one-to-one correspondence and at least partially overlap with the plurality of first openings;
with respect to one light shielding pattern and one first opening that are provided correspondingly, in the first direction parallel to the touch side surface, a length of the light shielding pattern is D, a length of the first opening is d2; and in the direction perpendicular to the touch side surface, a distance from the light shielding pattern to the light shielding layer is H, then:

$$D=d2+2H\times\tan\theta1,$$

where θ1 is a minimum critical angle of the optical path for texture recognition.

8. The texture recognition apparatus according to claim 6, wherein
with respect to one photosensitive element, at least two first openings and at least two light shielding patterns that are provided correspondingly, in the first direction parallel to the touch side surface, a length of the light shielding pattern is D, a distance between two adjacent light shielding patterns is P, a length of the first opening is d2; and in the direction perpendicular to the touch side surface, a distance from the light shielding pattern to the light shielding layer is H, then:

$$D=d2+2H\times\tan\theta1,$$

$$P=H\times(\tan\theta1+\tan\theta2),$$

where θ1 is a minimum critical angle of the optical path for texture recognition, and θ2 is a maximum critical angle of the optical path for texture recognition.

9. The texture recognition apparatus according to claim 8, wherein a planar shape of the first opening is a circle, a square or a rectangle;
in a case where the planar shape of the first opening is the circle, a diameter of the circle is d2, and 2 microns≤d2≤12.8 microns; or
in a case where the planar shape of the first opening is the square or the rectangle, a side length of the square or a length or a width of the rectangle extends along the first direction, and the side length of the square or the length or the width of the rectangle is d2, and 2 microns≤d2≤12.8 microns.

10. The texture recognition apparatus according to claim 8, wherein a range of the distance H from the light shielding pattern to the light shielding layer is: 4 microns≤H≤6 microns.

11. The texture recognition apparatus according to claim 1, further comprising a display panel, wherein the display panel comprises an array substrate; the array substrate comprises a base substrate and a sub-pixel array on the base substrate; the sub-pixel array comprises a plurality of sub-pixels,
the light source array comprises the sub-pixel array; and the plurality of light sources comprise the plurality of sub-pixels.

12. The texture recognition apparatus according to claim 11, wherein each of the plurality of sub-pixels comprises a pixel driving circuit on the base substrate; the pixel driving circuit comprises a thin film transistor; each of the plurality of image sensors further comprises a switch transistor on the base substrate; and
the thin film transistor and the switch transistor are arranged in a same layer.

13. The texture recognition apparatus according to claim 12, wherein the photosensitive element is provided on a side of the switch transistor away from the base substrate, and comprises a first electrode, a second electrode and a semiconductor layer between the first electrode and the second electrode; the first electrode is electrically connected with the switch transistor;
the array substrate further comprises a planarization layer provided on a side of the photosensitive element away from the base substrate; and the planarization layer has a first via and a second via;
each of the plurality of sub-pixels further comprises a light-emitting device; and the light-emitting device is provided on a side of the planarization layer away from the base substrate; the light-emitting device comprises a first light emission driving electrode, a second light emission driving electrode, and a light-emitting layer between the first light emission driving electrode and the second light emission driving electrode; the first light emission driving electrode is electrically connected with the thin film transistor at least through the first via;
the array substrate further comprises a connecting line provided in a same layer as the first light emission driving electrode; and the connecting line is electrically connected with the second electrode of the photosensitive element through the second via.

14. The texture recognition apparatus according to claim 13, wherein the array substrate further comprises a pixel definition layer provided on a side of the first light emission driving electrode and the connecting line away from the base substrate;

the pixel definition layer has a second opening exposing the first light emission driving electrode; and the light-emitting layer and the second light emission driving electrode are respectively at least partially formed in the second opening;

the light shielding matrix is provided on a side of the pixel definition layer away from the base substrate.

15. The texture recognition apparatus according to claim 14, wherein the pixel definition layer is configured to filter light with a wavelength greater than 600 nm.

16. The texture recognition apparatus according to claim 14, wherein the planarization layer is configured to comprise a light shielding layer, or the pixel definition layer is configured to comprise a light shielding layer, or both the planarization layer and the pixel definition layer are configured to respectively comprise a light shielding layer.

17. An electronic apparatus, comprising the texture recognition apparatus according to claim 1.

* * * * *